(12) United States Patent
Tian (10) Patent No.: US 9,312,255 B2
(45) Date of Patent: Apr. 12, 2016

(54) METHOD AND APPARATUS FOR ELECTROSTATIC DISCHARGE PROTECTION

(71) Applicant: Fairchild Semiconductor Corporation, San Jose, CA (US)

(72) Inventor: Guangchun Tian, Shanghai (CN)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 165 days.

(21) Appl. No.: 13/870,500

(22) Filed: Apr. 25, 2013

(65) Prior Publication Data

US 2013/0286517 A1  Oct. 31, 2013

(30) Foreign Application Priority Data

Apr. 28, 2012  (CN) .......................... 2012 1 0135067

(51) Int. Cl.
*H02H 3/20* (2006.01)
*H01L 27/02* (2006.01)

(52) U.S. Cl.
CPC ........ *H01L 27/0248* (2013.01); *H01L 27/0285* (2013.01); *H02H 3/20* (2013.01)

(58) Field of Classification Search
CPC .. H01L 27/0248; H01L 27/0285; H02H 3/20; H02H 3/22
See application file for complete search history.

(56) References Cited

U.S. PATENT DOCUMENTS

| 6,529,359 | B1 * | 3/2003 | Verhaege et al. | 361/100 |
| 6,552,583 | B1 * | 4/2003 | Kwong | 327/112 |
| 6,920,026 | B2 | 7/2005 | Chen | |
| 8,570,694 | B2 * | 10/2013 | Pugsley | 361/56 |

FOREIGN PATENT DOCUMENTS

| CN | 101442046 A | 5/2009 |
| CN | 102204054 A | 9/2011 |
| CN | 202797929 U | 3/2013 |

OTHER PUBLICATIONS

"Chinese Application Serial No. 201210135067.7 Office Action mailed Mar. 24, 2015", 16 pgs.

* cited by examiner

*Primary Examiner* — Zeev V Kitov
(74) *Attorney, Agent, or Firm* — Schwegman Lundberg & Woessner, P.A.

(57) ABSTRACT

This application discusses, among other things, apparatus and methods for electrostatic discharge (ESD) protection. In an example, an ESD protection circuit can include an ESD control circuit, and a driver-off circuit, wherein the ESD control circuit is configured to send an enable signal to the driver-off circuit and to perform electrostatic discharge to a ground node when detecting occurrence of electrostatic charges, and wherein the driver-off circuit is configured to disable a driving device upon reception of the enable signal.

15 Claims, 8 Drawing Sheets

METHOD AND APPARATUS FOR ELECTROSTATIC DISCHARGE PROTECTION

CLAIM OF PRIORITY

This application claims the benefit of priority under 35 U.S.C. 119 to China Patent Application Number, 201210135067.7, entitled, "ESD PROTECTIVE CIRCUIT, DRIVING CIRCUIT HAVING THE SAME, INTEGRATED CIRCUIT HAVING THE DRIVING CIRCUIT AND RELATED METHOD," filed Apr. 28, 2012, hereby incorporated by reference herein in its entirety.

TECHNICAL FIELD

The disclosure relates to the Electro-Static Discharge (ESD) technology, and in particular, to an ESD protection circuit and method, a driving circuit and an Integrated Circuit (IC).

BACKGROUND

Currently, ESD protection can be provided by coupling a ballasting resistor in series to an output of a driving device to limit the electrostatic current flowing to the driving device and increase the triggering electrostatic voltage of the driving device, thereby preventing the driving device from being damaged due to being triggered by the electrostatic charges. However, ESD protection methods in which a ballasting resistor is coupled in series to an output of a driving device can reduce the driving capacity of the driving circuit. Also, in many application products, the ballasting resistor may not be allowed to be arranged at the output of the driving circuit. Such products can include low-output-impedance application products.

In another existing ESD protection method, a silicide block mask can be applied to the driving device, thus, a serially coupled resistor can be embedded at the drain of the driver to perform self-protection. However, use of the silicide block can increase complexity of the fabrication process, as well as cost of the mask and the fabrication process. Also, spacing between the drain contact hole and the gate of the driving device may have to be enlarged, which can increase the size of the driving device resulting in larger layout areas of the driving device.

OVERVIEW

This application discusses, among other things, apparatus and methods for electrostatic discharge (ESD) protection. In an example, an ESD protection circuit can include an ESD control circuit, and a driver-off circuit, wherein the ESD control circuit is configured to send an enable signal to the driver-off circuit and to perform electrostatic discharge to a ground node when detecting occurrence of electrostatic charges, and wherein the driver-off circuit is configured to disable a driving device upon reception of the enable signal.

This overview is intended to provide a general overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Currently, ESD protection is provided by coupling a ballasting resistor in series to an output of a driving device to limit the electrostatic current flowing to the driving device and increase the triggering electrostatic voltage of the driving device, thereby preventing the driving device from being damaged due to being triggered by the electrostatic charges.

Figure 1:
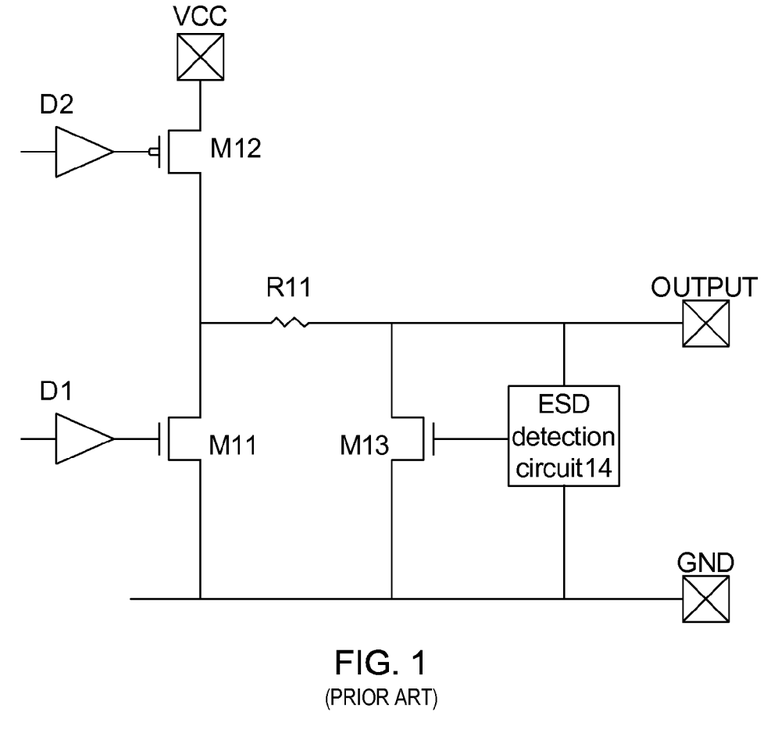
FIG. 1 is a schematic view of a push-pull driving circuit in the prior art.

FIG. 1 illustrates a push-pull driving circuit. The push-pull driving circuit can include driving devices, for example, an N-Metal-Oxide-Semiconductor (NMOS) transistor M11 and a P-Metal-Oxide-Semiconductor (PMOS) transistor M12. The gate of the NMOS M11 is coupled to the output of the first pre-driving device D11. The gate of the PMOS M12 is coupled to the output of the second pre-driving device D12. The source of the NMOS M11 is coupled to the ground node GND. The source of the PMOS M12 is coupled to the power supply VCC. A ballasting resistor is coupled in series to an output of the NMOS M11 and an output of the PMOS M12. When the driving circuit is not powered on, the gate voltage of the NMOS M11 is in an uncertain state, and the gate voltage of the ESD protection device NMOS M13 has not been pulled up to the voltage level of the gate of the NMOS M11 by the ESD detection circuit 14. Accordingly, the triggering voltage of the NMOS M11 may be lower than the triggering voltage of the NMOS M13.

Without the ballasting resistor R11, the driving device NMOS M11 may be triggered prior to the ESD protection device NMOS M13 when electrostatic charges occur, and thus significant electrostatic current would damage the driving device NMOS M11. With the ballasting resistor R11, even if the driving device NMOS M11 is triggered by the electrostatic charges prior to the ESD protection device NMOS M13, the ballasting resistor R11 would limit the significant electrostatic current to flow to the driving device NMOS M11, and the ESD protection device NMOS M13 which is triggered subsequently would discharge the electrostatic current at the output node OUTPUT to the ground node GND.

Figure 2:
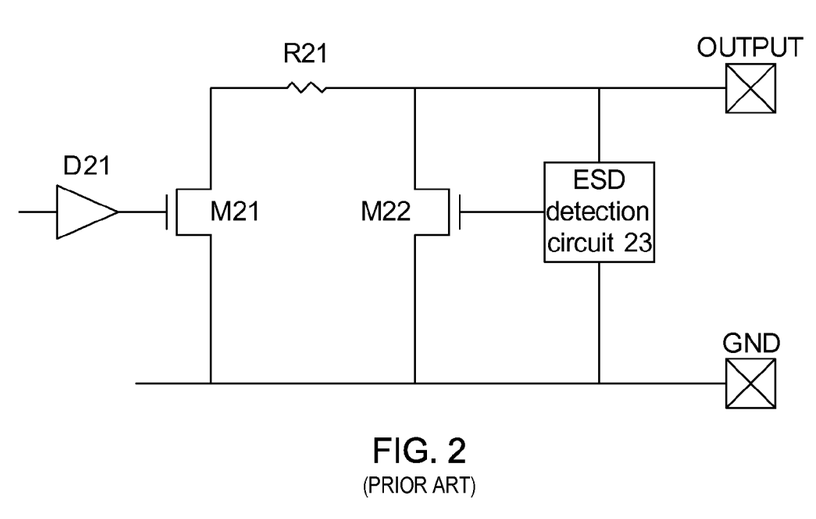
FIG. 2 is a schematic view of an open-drain driving circuit in the prior art.

FIG. 2 illustrates an open-drain driving circuit. A ballasting resistor R21 is coupled in series to an output of a driving device NMOS M21. The gate of the NMOS M21 is coupled to the first pre-driving device D21. When the driving circuit is not powered on, the gate voltage of the NMOS M21 is in an uncertain state, and the gate voltage of the ESD protection device NMOS M22 has not been pulled up to the voltage level of the gate of the NMOS M21 by the ESD detection circuit 23. Accordingly, the triggering voltage of the NMOS M21 may be lower than the triggering voltage of the NMOS M22. Without the ballasting resistor R21, the driving device NMOS M21 may be triggered prior to the ESD protection device NMOS M22 when electrostatic charges occur, and thus the significant electrostatic current would damage the driving device NMOS M21. With the ballasting resistor R21, even if the driving device NMOS M21 is triggered by the electrostatic charges prior to the ESD protection device NMOS M22, the ballasting resistor R21 would limit the significant electrostatic current to flow to the driving device NMOS M21, and the ESD protection device NMOS M22 which is triggered subsequently would discharge the electrostatic current at the output node OUTPUT to the ground node GND.

However, the ESD protection method, in which a ballasting resistor is coupled in series to an output of a driving device, reduces the driving capacity of the driving circuit which is powered on and in normal operation. Further, in many application products, the ballasting resistor is not allowed to be arranged at the output of the driving circuit. For example, for a low-output-impedance application product, no ballasting resistor, regardless of its resistance value, should be arranged at the output of the driving circuit.

The present inventor has recognized methods and apparatus for providing ESC protection. In certain examples an ESD control circuit, upon detecting occurrence of electrostatic charges, can send an enable signal to a driver-off circuit to disable the driving circuit and can perform electrostatic discharge from the output node to the ground node.

The present subject matter is discussed below in detail with reference to the accompanying drawings and examples.

Figure 3:
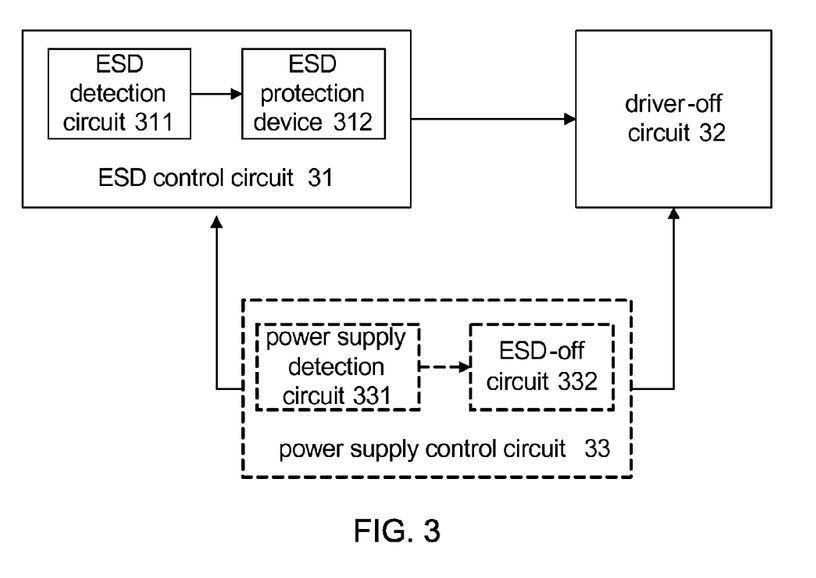
FIG. 3 is a structural schematic view of an ESD protection circuit according to an embodiment of the disclosure.

FIG. 3 illustrates generally an example ESD protection circuit. In certain examples, the ESD protection circuit can include an ESD control circuit 31 and a driver-off circuit 32. The ESD control circuit 31 is configured to send an enable signal to the driver-off circuit 32 and to perform electrostatic discharge to a ground node when detecting occurrence of electrostatic charges. The driver-off circuit 32 is configured to disable a driving device upon reception of the enable signal.

In certain examples, the ESD control circuit 31 can include an ESD detection circuit 311 and an ESD protection device 312. The ESD detection circuit 311 can be configured to send an enable signal to the ESD protection device 312 and the driver-off circuit 32 when detecting occurrence of electrostatic charges. The ESD protection device 312 can be configured to perform electrostatic discharge to the ground node upon reception of the enable signal. The ESD detection circuit 311 can include a capacitor and a resistor which are coupled in series. In certain examples, the ESD protection device 312 can include a Metal-Oxide-Semiconductor (MOS) field effect transistor (FET) or a Silicon Controlled Rectifier (SCR), etc. In some examples, the MOSFET can include an NMOS or the like.

In certain examples, the driver-off circuit 32 can be implemented using an NMOS or an NPN triode. In an example, the gate of the NMOS or the base of the NPN triode can be coupled to the ESD detection circuit 311 and can receive the enable signal from the ESD detection circuit 311. The drain of the NMOS or the collector of the NPN triode can be coupled to the driving device, and the source of the NMOS or the emitter of the NPN triode can be coupled to the ground node.

In certain examples, the ESD protection circuit can include a power supply control circuit 33 configured to disable the ESD control circuit 31 when detecting the power supply is in normal operation, in order not to interfere with the driving signal outputted by the driving device, and to cancel disabling of the ESD control circuit 31 when detecting the power supply is powered off, in order to enable normal operation of the ESD control circuit 31.

In some examples, the power supply control circuit 33 can include a power supply detection circuit 331 and an ESD-off circuit 332. The power supply detection circuit 331 can be configured to provide an enable signal to the ESD-off circuit 332 when detecting the power supply is in normal operation and to provide a disable signal to the ESD-off circuit 332 when detecting the power supply is powered off. The ESD-off circuit 332 can be configured to disable the ESD control circuit 31 upon receiving the enable signal from the power supply detection circuit 311 and to cancel disabling of the ESD control circuit 31 upon receiving the disable signal from the power detection circuit. In an example, the power supply detection circuit 331 can include a capacitor and a resistor coupled in series.

In certain examples, the ESD-off circuit 332 can be implemented using an NMOS or an NPN triode. The gate of the NMOS or the base of the NPN triode can be coupled to the power supply detection circuit 331 and receives the enable signal from the power supply detection circuit 31. The drain of the NMOS or the collector of the NPN triode can be coupled to the ESD control circuit 31. The source of the NMOS or the emitter of the NPN triode can be coupled to the ground node.

Figure 4:
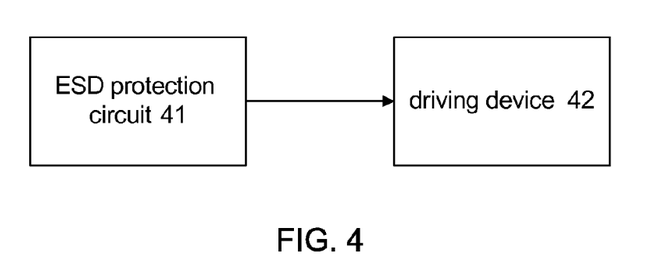
FIG. 4 is a structural schematic view of a driving circuit according to an embodiment of the disclosure.

In certain examples, an ESD protection circuit as discussed above, can include, can be part of, or can be associated with a driving circuit. FIG. 4 illustrates generally and example driving circuit that can include an example ESD protection circuit 41 and a driving device 42. In certain examples, the ESD protection circuit 41 is configured to disable the driving device 42 and perform electrostatic discharge to the ground node when detecting occurrence of electrostatic charges. The driving device 42 can be configured to output, during normal operation, a driving signal. In certain examples, the driving device 42 can include an NMOS or the like. In an example, the gate of the NMOS can be coupled to receive a control signal containing an enable/disable signal, the drain of the NMOS can be an output, and the source of the NMOS can be coupled to the ground node.

The ESD protection circuit 41, as shown in FIG. 3, includes an ESD control circuit 31 and a driver-off circuit 32.

The ESD control circuit 31 is configured to send an enable signal to the driver-off circuit 32 and to perform electrostatic discharge to a ground node when detecting occurrence of electrostatic charges. The driver-off circuit 32 is configured to disable a driving device upon reception of the enable signal.

In certain examples, the ESD control circuit 31 can include an ESD detection circuit 311 and an ESD protection device 312. The ESD detection circuit 311 can be configured to send an enable signal to the ESD protection device 312 and the driver-off circuit 32 when detecting occurrence of electrostatic charges. The ESD protection device 312 can be configured to perform electrostatic discharge to the ground node upon reception of the enable signal. The ESD detection circuit 311 can include a capacitor and a resistor which are coupled in series. In certain examples, the ESD protection device 312 can include a Metal-Oxide-Semiconductor (MOS) field effect transistor (FET) or a Silicon Controlled Rectifier (SCR), etc. In some examples, the MOSFET can include an NMOS or the like.

In certain examples, the driver-off circuit 32 can be implemented using an NMOS or an NPN triode. In an example, the gate of the NMOS or the base of the NPN triode can be coupled to the ESD detection circuit 311 and can receive the enable signal from the ESD detection circuit 311. The drain of the NMOS or the collector of the NPN triode can be coupled to the driving device, and the source of the NMOS or the emitter of the NPN triode can be coupled to the ground node.

In certain examples, the ESD protection circuit can include a power supply control circuit 33 configured to disable the ESD control circuit 31 when detecting the power supply is in normal operation, in order not to interfere with the driving signal outputted by the driving device, and to cancel disabling of the ESD control circuit 31 when detecting the power supply is powered off, in order to enable normal operation of the ESD control circuit 31.

In some examples, the power supply control circuit 33 can include a power supply detection circuit 331 and an ESD-off circuit 332. The power supply detection circuit 331 can be configured to provide an enable signal to the ESD-off circuit 332 when detecting the power supply is in normal operation and to provide a disable signal to the ESD-off circuit 332 when detecting the power supply is powered off. The ESD-off circuit 332 can be configured to disable the ESD control circuit 31 upon receiving the enable signal from the power supply detection circuit 311 and to cancel disabling of the ESD control circuit 31 upon receiving the disable signal from the power detection circuit. In an example, the power supply detection circuit 331 can include a capacitor and a resistor coupled in series.

In certain examples, the ESD-off circuit 332 can be implemented using an NMOS or an NPN triode. The gate of the NMOS or the base of the NPN triode can be coupled to the power supply detection circuit 331 and receives the enable signal from the power supply detection circuit 31. The drain of the NMOS or the collector of the NPN triode can be coupled to the ESD control circuit 31. The source of the NMOS or the emitter of the NPN triode can be coupled to the ground node.

In certain examples, an ESD protection circuit as discussed above, can include, can be part of, or can be associated with a driving circuit. FIG. 4 illustrates generally and example driving circuit that can include an example ESD protection circuit 41 and a driving device 42. In certain examples, the ESD protection circuit 41 is configured to disable the driving device 42 and perform electrostatic discharge to the ground node when detecting occurrence of electrostatic charges. The driving device 42 can be configured to output, during normal operation, a driving signal. In certain examples, the driving device 42 can include an NMOS or the like. In an example, the gate of the NMOS can be coupled to receive a control signal containing an enable/disable signal, the drain of the NMOS can be an output, and the source of the NMOS can be coupled to the ground node.

Figure 5:
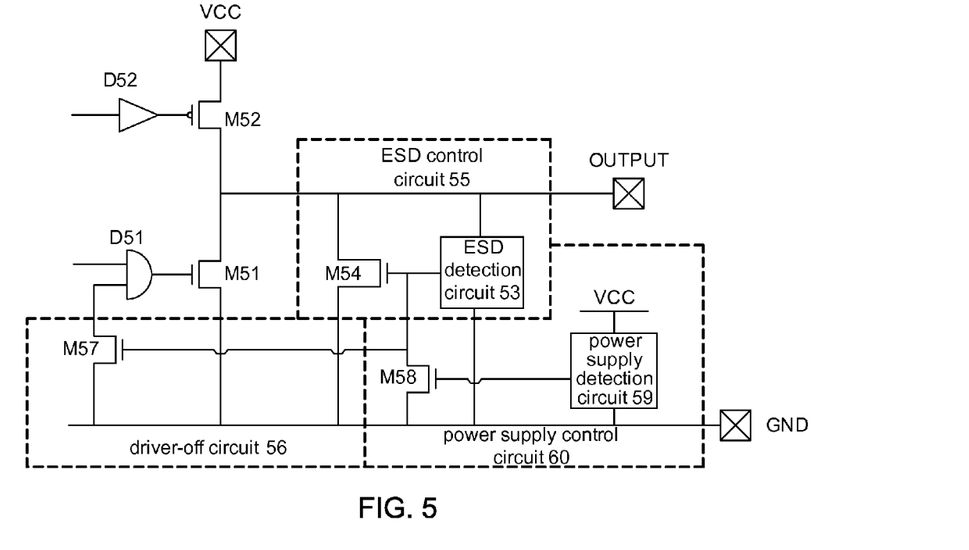
FIG. 5 is a schematic view of a push-pull driving circuit according to an embodiment of the disclosure.

FIG. 5 illustrates generally a push-pull driving circuit including an example ESD control circuit. The push-pull driving circuit can include a driving device NMOS M51 and PMOS M52 to form a push-pull output circuit. In an example, the gate of the NMOS M51 is coupled to the output of the first pre-driving device D51. The gate of the PMOS M52 is coupled to the output of the second pre-driving device D52. The source of the NMOS M51 is coupled to the ground node GND. The source of the PMOS M52 is coupled to the power supply VCC. The drain output of the NMOS M51 and the drain output of the PMOS M52 are coupled to the detection terminal of the ESD detection circuit 53 and the drain of the NMOS M54. The ESD control circuit 55 can include NMOS M54 as an ESD protection device. In certain examples, the ESD detection circuit 53 and the NMOS M54 can form the ESD control circuit 55.

In an example, the output of the ESD detection circuit 53 is coupled to the gate of the NMOS M54, the gate of the NMOS M57 which acts as the driver-off circuit 56, and the drain of the NMOS M58 which acts as the ESD-off circuit. The drain of the NMOS M54 is coupled to the input of the first pre-driving device D51. The gate of the NMOS M58 is coupled to the output of the power supply detection circuit 59. The gates of the NMOS M54, the NMOS M57 and the NMOS M58 are coupled to the ground node GND. The detection terminal of the power supply detection circuit 59 is coupled to the power supply VCC. In certain examples, the power supply detection circuit 59 and the NMOS M58 can form the power supply control circuit 60.

In an example, when the ESD detection circuit detects occurrence of the electrostatic charges at the output node OUTPUT, the ESD detection circuit can output, or provide, an enable signal to the NMOS M54 and the NMOS M57, the NMOS M57 is thus turned on, which pulls down the input of the first pre-driving device D51, which then pulls down the gate voltage of the NMOS M51 and increases the triggering voltage of the NMOS M51, the NMOS M54 is thus turned on, such that electrostatic discharge is performed from the output node OUTPUT to the ground node GND. When detecting the power supply VCC is normal, the power supply detection circuit 59 outputs an enable signal, and the NMOS M58 is thus turned on, which pulls down the gate voltage of the NMOS M54 and the NMOS M57, such that the NMOS M54 and the NMOS M57 would not interfere with the driving signal output from the drains of the NMOS M51 and the PMOS M52. When detecting the power supply VCC is powered off, the power supply detection circuit 59 ceases to output the enable signal, and the NMOS M58 is thus turned off. Accordingly, the gate voltage of the NMOS M54 and the NMOS M57 is no longer pulled down, such that the NMOS M54 and the NMOS M57 may operate normally when the electrostatic charges occur.

Figure 6:
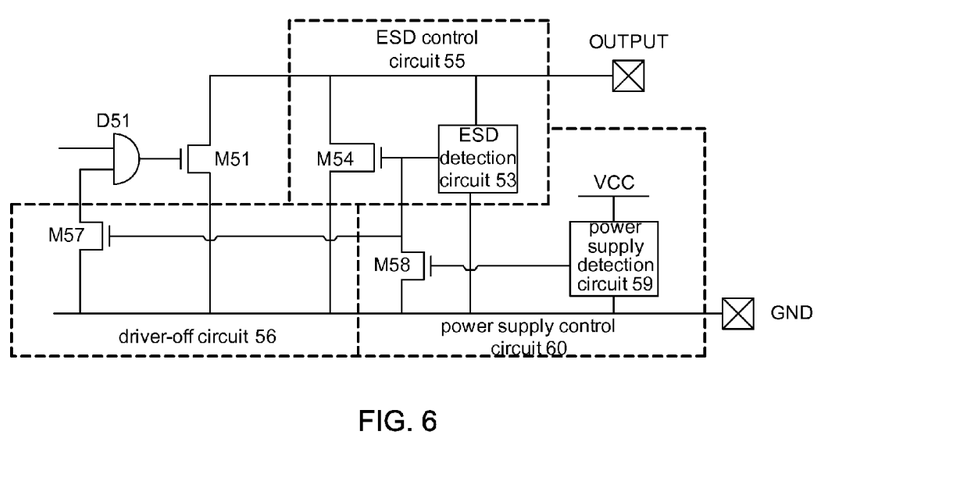
FIG. 6 is a schematic view of an open-drain driving circuit according to an embodiment of the disclosure.

FIG. 6 illustrates generally an open-drain driving circuit including an example ESD control circuit. The illustrated open-drain driving circuit of FIG. 6 is similar to the push-pull driving circuit as described above in terms of the specific connection relationship and operation fashion. Differences lie in that, in FIG. 6, only the NMOS M51 is used as the driving device and the PMOS M52 of FIG. 5 is not employed.

Figure 7:
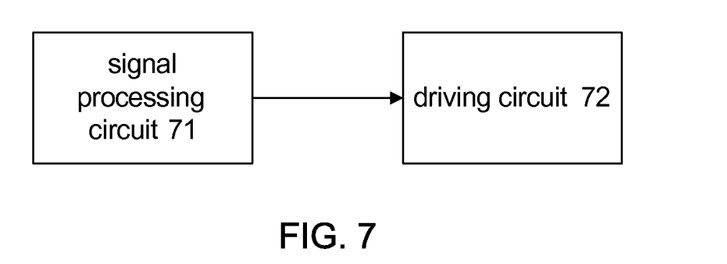
FIG. 7 is a structural schematic view of an integrated circuit according to an embodiment of the disclosure.

FIG. 7 illustrates generally an example integrated circuit. In certain examples, the integrated circuit can include a signal processing circuit 71 and a driving circuit 72. The signal processing circuit 71 can be configured to process, during normal operation, a signal and control the driving circuit 72 to output a driving signal based on the processed signal. The driving circuit 72 can be configured to output, during normal operation, the driving signal and to disable the driving device and perform electrostatic discharge to a ground node when detecting occurrence of electrostatic charges.

The driving circuit 72, as shown in FIG. 4, can include an ESD protection circuit 41 and a driving device 42. In certain examples, the ESD protection circuit 41 is configured to disable the driving device 42 and perform electrostatic discharge to the ground node when detecting occurrence of electrostatic charges. The driving device 42 is configured to output, during normal operation, a driving signal.

In certain examples, the driving device 42 may be an NMOS or the like. The gate of the NMOS can be coupled to receive a control signal containing an enable/disable signal, the drain of the NMOS can act as an output, and the source of the NMOS can be coupled to the ground node.

The ESD protection circuit 41, as shown in FIG. 3, includes an ESD control circuit 31 and a driver-off circuit 32.

The ESD control circuit 31 is configured to send an enable signal to the driver-off circuit 32 and to perform electrostatic discharge to a ground node when detecting occurrence of electrostatic charges. The driver-off circuit 32 is configured to disable a driving device upon reception of the enable signal.

In certain examples, the ESD control circuit 31 can include an ESD detection circuit 311 and an ESD protection device 312. The ESD detection circuit 311 can be configured to send an enable signal to the ESD protection device 312 and the driver-off circuit 32 when detecting occurrence of electrostatic charges. The ESD protection device 312 can be configured to perform electrostatic discharge to the ground node upon reception of the enable signal. The ESD detection circuit 311 can include a capacitor and a resistor which are coupled in series. In certain examples, the ESD protection device 312 can include a Metal-Oxide-Semiconductor (MOS) field effect transistor (FET) or a Silicon Controlled Rectifier (SCR), etc. In some examples, the MOSFET can include an NMOS or the like.

In certain examples, the driver-off circuit 32 can be implemented using an NMOS or an NPN triode. In an example, the gate of the NMOS or the base of the NPN triode can be coupled to the ESD detection circuit 311 and can receive the enable signal from the ESD detection circuit 311. The drain of the NMOS or the collector of the NPN triode can be coupled to the driving device, and the source of the NMOS or the emitter of the NPN triode can be coupled to the ground node.

In certain examples, the ESD protection circuit can include a power supply control circuit 33 configured to disable the ESD control circuit 31 when detecting the power supply is in normal operation, in order not to interfere with the driving signal outputted by the driving device, and to cancel disabling of the ESD control circuit 31 when detecting the power supply is powered off, in order to enable normal operation of the ESD control circuit 31.

In some examples, the power supply control circuit 33 can include a power supply detection circuit 331 and an ESD-off circuit 332. The power supply detection circuit 331 can be configured to provide an enable signal to the ESD-off circuit 332 when detecting the power supply is in normal operation and to provide a disable signal to the ESD-off circuit 332 when detecting the power supply is powered off. The ESD-off circuit 332 can be configured to disable the ESD control circuit 31 upon receiving the enable signal from the power supply detection circuit 311 and to cancel disabling of the ESD control circuit 31 upon receiving the disable signal from the power detection circuit. In an example, the power supply detection circuit 331 can include a capacitor and a resistor coupled in series.

In certain examples, the ESD-off circuit 332 can be implemented using an NMOS or an NPN triode. The gate of the NMOS or the base of the NPN triode can be coupled to the power supply detection circuit 331 and receives the enable signal from the power supply detection circuit 31. The drain of the NMOS or the collector of the NPN triode can be coupled to the ESD control circuit 31. The source of the NMOS or the emitter of the NPN triode can be coupled to the ground node.

Figure 8:
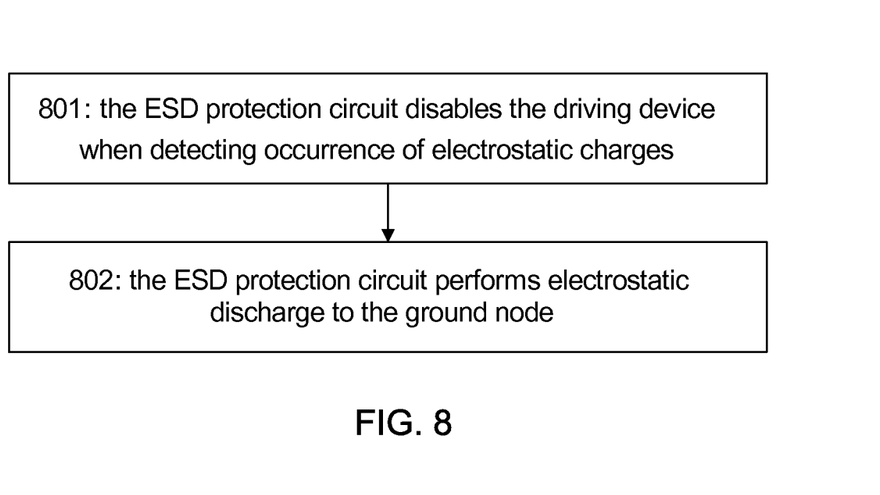
FIG. 8 is a flowchart of an ESD protection method according to an embodiment of the disclosure.

FIG. 8 illustrates a flowchart of an example ESD protection method. In certain examples, an ESD protection method can include the following steps:

Step 801: the ESD protection circuit disables the driving device when detecting the occurrence of the electrostatic charges.

In certain examples, when the ESD detection circuit in the ESD protection circuit detects the occurrence of the electrostatic charges, the ESD detection circuit sends an enable signal to the ESD protection device and the driver-off circuit, the driver-off circuit disables the driving device based on the received enable signal.

Step 802: the ESD protection circuit performs electrostatic discharge to the ground node.

In certain examples, the ESD protection device in the ESD protection circuit performs electrostatic discharge to the ground node based on the enable signal.

The ESD detection circuit may consist of a capacitor and a resistor which are coupled in serial.

The ESD protection circuit may be a MOS transistor or a Silicon Control Rectifier (SCR), etc.

The MOS may be an NMOS or the like.

The driver-off circuit may be implemented as an NMOS or an NPN triode.

In some examples, the method can include: detecting whether the power supply is normal by using the power supply control circuit; when detecting that the power supply is normal, disabling the ESD detection circuit and the ESD protection device, such that the ESD detection circuit and the ESD protection device would not interfere with the driving signal output from the driving device; when detecting that the power supply is powered off, canceling the disable of the ESD detection circuit and the ESD protection device, to enable normal operation of the ESD control circuit.

ESD testings can be performed on the driving circuits with the driver-off circuit and without the driver-off circuit, respectively, and their difference in antistatic capacity (the maximum dischargable electrostatic current) are illustrated below.

Figure 9:
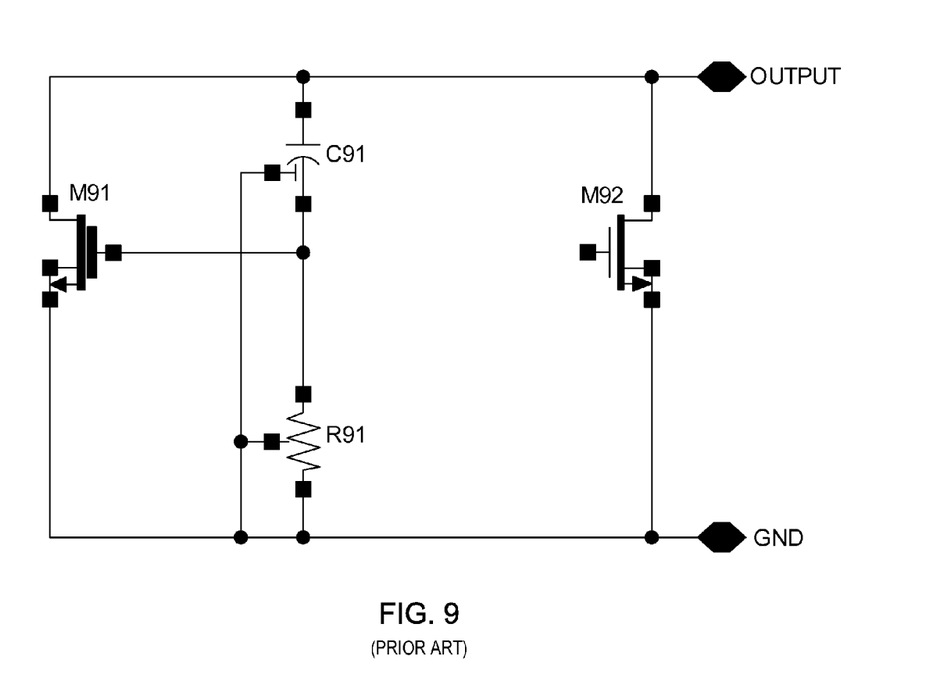
FIG. 9 is a schematic view of a driving circuit without a driver-off circuit in the prior art.
Figure 10:
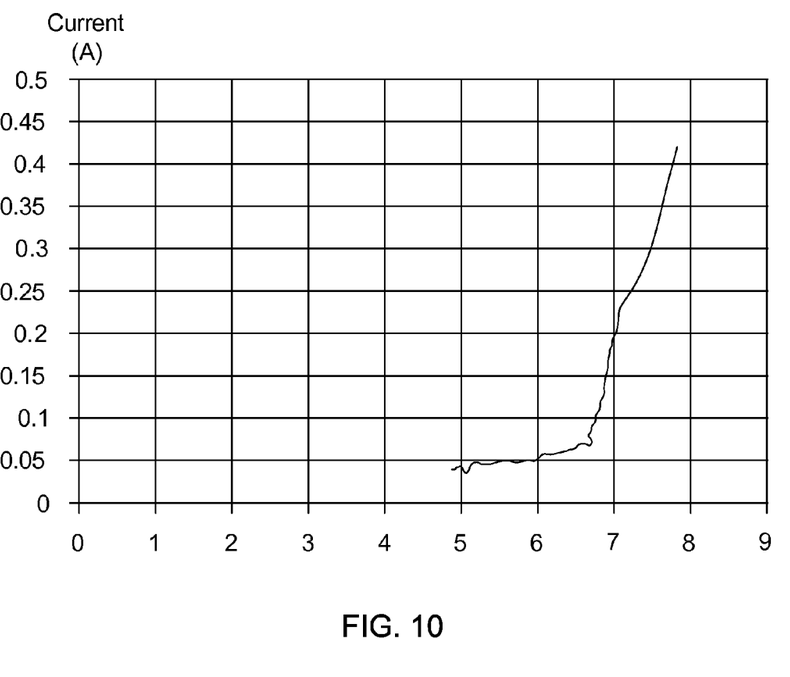
FIG. 10 is a schematic view of an ESD test result of a driving circuit without a driver-off circuit in the prior art.

FIG. 9 illustrates an existing driving circuit without a driver-off circuit. The NMOS M91 is an ESD protection device, and the capacitor C91 and the resistor R91 are coupled in series to act as an ESD detection circuit, and the NMOS M92 is a driving device. As shown in FIG. 10, in a driving circuit with a driver-off circuit, the ESD capacity of the driving device NMOS M92 is just 0.43 A, which is equivalent to a Human-Body Model (HBM) ESD capacity of 645V (=0.43 A*1500 ohms).

Figure 11:
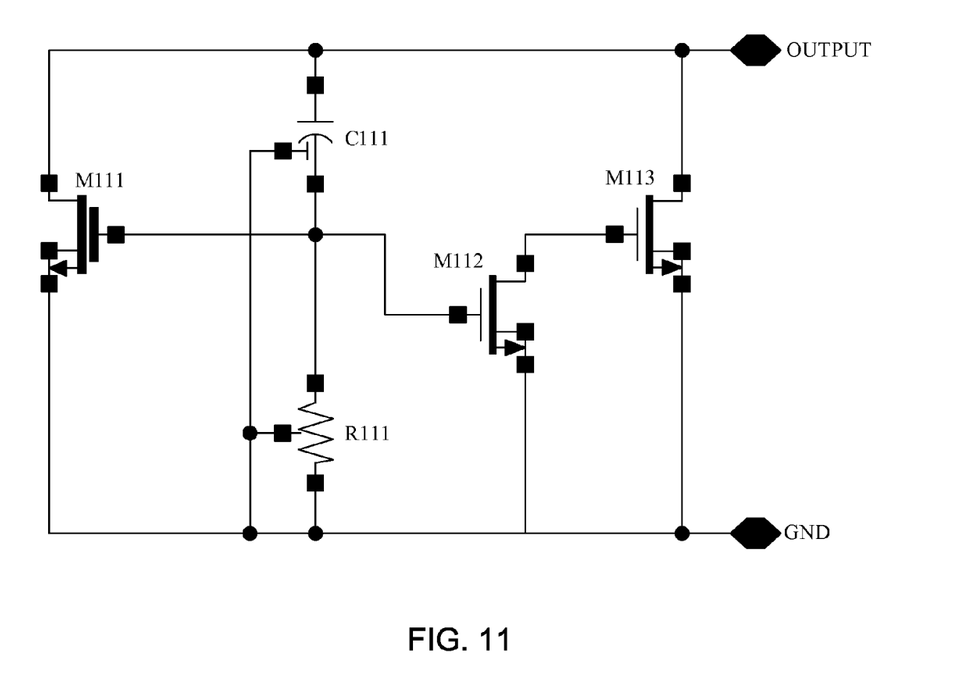
FIG. 11 is a schematic view of a driving circuit with a driver-off circuit according to the disclosure.
Figure 12:
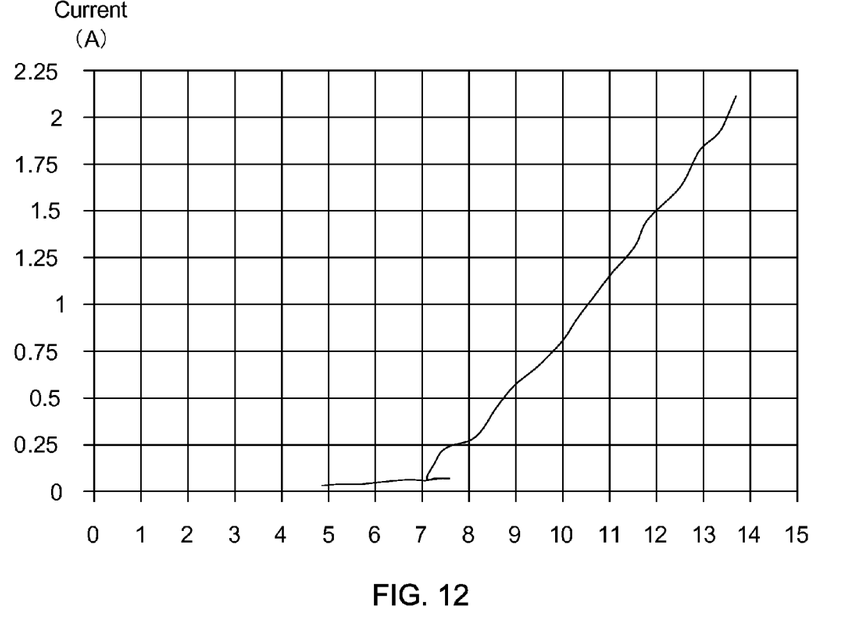
FIG. 12 is a schematic view of an ESD test result of a driving circuit with a driver-off circuit according to the disclosure.

FIG. 11 illustrates generally an example driving circuit with a driver-off circuit. In the driving circuit, the NMOS M111 is an ESD protection device, the capacitor C111 and the resistor R111 are coupled in serial to act as an ESD detection circuit, and the NMOS M112 acts as a driver-off circuit. In the NMOS M112, the gate is coupled to the node of the capacitor C111 and the resistor R111, the drain is coupled to the gate of the NMOS M113 which acts as a driving device, and the source is coupled to the ground node GND. As shown in FIG. 12, in a driving circuit with a driver-off circuit, the ESD capacity of the driving device NMOS M113 is 2.13 A, which is equivalent to a Human-Body Model (HBM) ESD capacity of 3195V (=2.13 A*1500 ohms).

As can be seen, the driver-off circuit can increase the triggering voltage of the driving device, prevent the driving device from being triggered when the electrostatic charges occur, discharge the electrostatic current to the ground node through the ESD protection device and effectively increase the ESD capacity of the driving circuit. In certain examples, the ESD protection device does not include a resistor coupled in series to the output of the driving device. In certain examples, the ESD protection device does not include a silicide block applied to the driving device. In certain example circuits that do not include a resistor coupled in series with the output or a silicide block applied to the driving device, an example ESD protection circuit with a driver-off circuit can be protected effectively. Since there is no need to arrange a ballasting resistor, add a silicide block mask or increase fabrication process complexity, the driving capacity of the driving circuit can be increased, the layout area can be saved, the process can be simplified, and the cost can be reduced.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An Electrostatic Discharge (ESD) protection circuit configured to couple to an output terminal driven by an output transistor, the ESD protection circuit comprising:
    an ESD detection circuit;
    an ESD protection circuit including an ESD protection transistor, the ESD protection transistor distinct from the output transistor; and
    a power supply control circuit including:
        a power supply detection circuit configured to detect a state of a power supply; and
        an ESD-off transistor, wherein the ESD-off transistor is configured to control a control node of the ESD protection transistor when a power supply is in a normal "on" state;
    wherein the ESD detection circuit is configured to send an enable signal to the ESD protection circuit;
    wherein the an ESD protection transistor is configured to perform electrostatic discharge directly to a ground node upon reception of the enable signal.

2. The ESD protection circuit according to claim 1, wherein the ESD detection circuit consists of a capacitor and a resistor which are coupled in serial, and
    wherein the ESD protection device is a Metal-Oxide-Semiconductor (MOS) field effect transistor or a Silicon Controlled Rectifier (SCR).

3. The ESD protection circuit according to claim 1, wherein the driver-off circuit is implemented as an NMOS or an NPN triode;
    wherein a gate of the NMOS or a base of the NPN triode is coupled to the ESD detection circuit and receives the enable signal from the ESD detection circuit;
    wherein a drain of the NMOS or a collector of the NPN triode is coupled to the driving device; and
    wherein a source of the NMOS or an emitter of the NPN triode is coupled to the ground node.

4. The ESD protection circuit according to claim 1, wherein the ESD-off transistor is configured to release control of the control node of the ESD protection transistor when the power supply detection circuit does not detect the power supply is in the normal "on" state in order to enable normal operation of the ESD control circuit.

5. A driving circuit comprising:
    an ESD protection circuit including an ESD protection transistor, the ESD protection circuit configured to detect an occurrence of electrostatic charges; and
    a driving device distinct from the ESD protection transistor; and
    a power supply detection circuit including an ESD-off transistor, the ESD-off transistor configured to control a control node of the ESD protection transistor when a power supply is in a normal "on" state;
    wherein the ESD protection circuit is configured to disable the driving device,
    wherein the ESD protection transistor is configured to perform electrostatic discharge to a ground node during the occurrence of electrostatic charges; and
    wherein the driving device is configured to output, during normal operation, a driving signal.

6. The driving circuit according to claim 5, wherein the ESD protection circuit includes:
    an ESD control circuit; and
    a driver-off circuit;
    wherein the ESD control circuit is configured to send an enable signal to the driver-off circuit and to the ESD protection transistor to perform electrostatic discharge to a ground node when detecting occurrence of electrostatic charges; and
    wherein the driver-off circuit is configured to disable the driving device upon reception of the enable signal.

7. The driving circuit according to claim 6, wherein the ESD protection transistor is configured to perform electrostatic discharge to the ground node upon reception of the enable signal.

8. The driving circuit according to claim 7, wherein the ESD detection circuit consists of:
   a capacitor; and
   a resistor coupled in series with the capacitor; and
   wherein the ESD protection circuit is a MOS transistor or a Silicon Control Rectifier.

9. The driving circuit according to claim 7, wherein the driver-off circuit is implemented as an NMOS or an NPN triode;
   wherein a gate of the NMOS or a base of the NPN triode is coupled to the ESD detection circuit and is configured to receive the enable signal from the ESD detection circuit;
   wherein a drain of the NMOS or a collector of the NPN triode is coupled to the driving device; and
   wherein a source of the NMOS or an emitter of the NPN triode is coupled to the ground node.

10. The driving circuit of claim 7, comprising a signal processing circuit configured to process, during normal operation, a signal and control the driving circuit to output the driving signal based on the processed signal.

11. The driving circuit according to claim 10, wherein an integrated circuit includes
    the signal processing circuit,
    the ESD protection circuit; and
    the driving device.

12. An ESD protection method for protecting an output terminal, configured to be driven by an driving device, from damage due to an occurrence of electrostatic charge, the method comprising:
    detecting the occurrence of electrostatic charge using and ESD protection circuit;
    providing an ESD enable signal to an ESD protection transistor, the ESD protection transistor distinct from the driving device;
    performing electrostatic discharge directly to a ground node using the ESD protection transistor in response to the ESD enable signal;
    detecting whether a power supply is normal by using a power supply control circuit; and
    when detecting that the power supply is normal, controlling a control node of the ESD protection transistor using a ESD-off transistor of the power supply control circuit to disable the ESD protection transistor from discharging charge to ground, such that the ESD protection transistor does not interfere with a driving signal output from the driving device.

13. The ESD protection method according to claim 12, including:
    detecting whether a power supply is powered off using the power supply control circuit;
    and
    when detecting that the power supply is powered off, releasing control of the control node of the ESD protection transistor via the ESD-off transistor to allow the ESD protection transistor to interfere with the driving signal output upon detection of the occurrence of electrostatic charge.

14. The ESD protection circuit of claim 1, including a driver-off circuit configured to disable a driving device upon reception of the enable signal.

15. The ESD protection method according to claim 12, including disabling the driving device using the ESD protection circuit.

* * * * *